(12) United States Patent
Chen et al.

(10) Patent No.: US 12,038,469 B2
(45) Date of Patent: Jul. 16, 2024

(54) SYSTEM AND METHOD FOR MEASURING INTERMITTENT OPERATING LIFE OF GaN-BASED DEVICE

(71) Applicant: INNOSCIENCE (SUZHOU) TECHNOLOGY CO., LTD., Suzhou (CN)

(72) Inventors: Chang Chen, Suzhou (CN); Chunhua Zhou, Suzhou (CN); Sichao Li, Suzhou (CN); Rong Yang, Suzhou (CN); Donghua Bai, Suzhou (CN); Jiabiao Huang, Suzhou (CN)

(73) Assignee: INNOSCIENCE (SUZHOU) TECHNOLOGY CO., LTD., Suzhou (CN)

( * ) Notice: Subject to any disclaimer, the term of this patent is extended or adjusted under 35 U.S.C. 154(b) by 411 days.

(21) Appl. No.: 17/419,309

(22) PCT Filed: Feb. 26, 2021

(86) PCT No.: PCT/CN2021/078237
§ 371 (c)(1),
(2) Date: Jun. 29, 2021

(87) PCT Pub. No.: WO2022/178857
PCT Pub. Date: Sep. 1, 2022

(65) Prior Publication Data
US 2022/0381815 A1 Dec. 1, 2022

(51) Int. Cl.
*G01R 31/26* (2020.01)
(52) U.S. Cl.
CPC ..... *G01R 31/2642* (2013.01); *G01R 31/2617* (2013.01); *G01R 31/2619* (2013.01)

(58) Field of Classification Search
None
See application file for complete search history.

(56) References Cited

U.S. PATENT DOCUMENTS 9,778,313 B2 * 10/2017 Chen .................. G01R 31/2855
10,101,382 B2 * 10/2018 Paikin ................ G01R 31/2849
(Continued)

FOREIGN PATENT DOCUMENTS

| CN | 107422243 A | 12/2017 |
| CN | 109164370 A | 1/2019 |

(Continued)

OTHER PUBLICATIONS

International Search Report and Written Opinion of the corresponding PCT application No. PCT/CN2021/078237 dated Dec. 8, 2021.
(Continued)

*Primary Examiner* — Jermele M Hollington
(74) *Attorney, Agent, or Firm* — JCIPRNET (57) ABSTRACT

The present invention provides a system and method for measuring an intermittent operating life (IOL) of a GaN-based device under test (DUT) is provided. The system is operable in a stressing mode, a cooling mode and a measure mode. A power regulation approach is adopted to ensure that DUT of the same thermal resistance have same temperature increase during the IOL test. The present invention eliminates the influence caused by parasitic parameters of testing circuits and the inconsistency of threshold voltage and drain-source resistance of the device itself. Through power regulation, it is the junction temperature of the device, not the housing temperature of the device, being directly controlled. Therefore, higher measurement accuracy can be achieved.

20 Claims, 4 Drawing Sheets

(56) References Cited

U.S. PATENT DOCUMENTS

| | | | | |
|---|---|---|---|---|
| 11,747,390 B2* | 9/2023 | Yang | ............... | G01R 31/2621 324/762.09 |
| 2010/0318313 A1* | 12/2010 | Agarwal | ........ | G01R 31/318511 702/117 |
| 2018/0321304 A1* | 11/2018 | Clauter | ............. | G01R 31/2628 |
| 2019/0033362 A1 | 1/2019 | Aeloiza et al. | | |

FOREIGN PATENT DOCUMENTS

| | | | |
|---|---|---|---|
| CN | 109814020 | A | 5/2019 |
| CN | 110579698 | A | 12/2019 |
| CN | 209746082 | U | 12/2019 |
| CN | 110850174 | A | 2/2020 |
| CN | 111487513 | A | 8/2020 |
| CN | 112345907 | A | 2/2021 |
| JP | 2011204877 | A | 10/2011 |

OTHER PUBLICATIONS

Sungsoon Choi et al., Delamination lifetime evaluation of IPM by accelerated power cycle test, 2014 International Conference on Electronics, Information and Communications (ICEIC), Dec. 31, 2014. p. 2, Line 1~4.

Yuan Chen et al., Impact of Test Stress (Tcmin) on intermittent operating life, 2016 17th International Conference on Electronic Packaging Technology, Dec. 31, 20161, p. 700-703.

* cited by examiner

SYSTEM AND METHOD FOR MEASURING INTERMITTENT OPERATING LIFE OF GaN-BASED DEVICE

TECHNICAL FIELD

The subject application generally relates to a system and method for measuring an intermittent operating life (IOL) of a semiconductor device, and more particularly relates to an apparatus and method for measuring an IOL of a gallium nitride (GaN) based device.

BACKGROUND

GaN-based devices have been widely used for high frequency electrical energy conversion systems because of low power losses and fast switching transition. In comparison with a silicon metal oxide semiconductor field effect transistor (MOSFET), a GaN high-electron-mobility transistor (HEMT) has a much better figure of merit and more promising performance for high-power and high-frequency applications.

An intermittent operating life (IOL) test is one of the important reliability tests for GaN-based devices. The purpose of the IOL test is to determine the integrity of the chip and/or package assembly by cycling on (device thermally heated due to power dissipation) and cycling off (device thermally cooling due to removal of power applied) as is normally experienced in a "real world" environment. In an IOL test, DC power is applied to the device until the desired junction temperature is reached. The power is then switched off, and forced air cooling applied until the junction temperature decreases to an ambient temperature.

In one approach, the device temperature may be measured by detecting the outer housing temperature of the device with an infra-red temperature sensing equipment. However, this approach is not suitable for batch processing as the cost of infra-red temperature sensing equipment is usually very high. In another approach, the device temperature may be measured by connecting a thermal-couple to the outer housing (or package) of the device. However, this approach has a very low testing efficiency as the response speed of thermal couple is relatively slow. Also, the testing result is heavily dependent on the ambient temperature which may result in measurement errors. In yet another approach, the device temperature may be determined by directly measuring a drain-source voltage $V_{ds}$ and a drain-source current Ids to determine an on-resistance of the device which is then used to calculate the junction temperature of the device based on a simulation model. However, for a low voltage (<100V) GaN-based transistor, its on-resistance value $R_{dson}$ is about 10 mOhm. If the drain-source current Ids equals to 1 A, then the drain-source voltage $V_{ds}$ equals to 10 mV. In order to achieve required measuring accuracy, the sampling resolution of $V_{ds}$ needs to be higher than 0.1 mV, therefore high-precision operational amplifier chips and analog to digital conversion (A/D) circuits are required. Moreover, for batch processing, such as a few hundred devices are measured at the same time, multiple digital signal processor (DSP) chips are required to control the sampling of $V_{ds}$, which will significantly increase the cost of overall testing costs.

SUMMARY

An object of the subject application is to address aforesaid short-comings and provide a IOL measuring system and method with high accuracy, low cost and ability to be scaled up for batch processing.

In accordance with one aspect of the present disclosure, a system for measuring an intermittent operating life (IOL) of a GaN-based device under test (DUT) is provided. The system is operable in a stressing mode, a cooling mode and a measure mode, and comprising: a controlling unit configured for detecting a signal $V_{D\_IM}$ from a drain terminal of the DUT and a signal $V_{S\_IM}$ from a source terminal of the DUT and computing a drain-source resistance $R_{ds}$ of the DUT when the system is operated in the measure mode; a stressing unit configured for applying a regulated stressing power $P_{str}$ to the DUT to increase a junction temperature of the DUT to an ON-junction temperature $T_{jON}$ when the system is operated in the stressing mode; a cooling unit configured for cooling the DUT to decrease the junction temperature of the DUT to an OFF junction temperature $T_{jOFF}$; a gate-bias unit configured to receive a control signal VG_M from the controlling unit to turn on the DUT when the system is operated in the measure mode; and receive a control signal VG_OFF from the controlling unit to turn off the DUT when the system is operated in the cooling mode; and a measure-bias unit configured to receive a reference signal IM_Ctrl from the controlling unit and supply a regulated drain-source current $I_{ds\_mea}$ to the DUT when the testing system is operated in the measure mode. The controlling unit is further configured to determine the drain-source resistance $R_{ds}$ to be an ON-drain-source resistance $R_{ds\_ON}$ of the DUT if the drain-source resistance $R_{ds}$ is obtained when the junction temperature of the DUT reaches an ON-junction temperature $T_{jON}$; and determine the drain-source resistance $R_{ds}$ to be an OFF-drain-source resistance $R_{ds\_OFF}$ of the DUT if the drain-source resistance $R_{ds}$ is obtained when the junction temperature of the DUT reaches an OFF junction temperature $T_{jOFF}$.

In accordance with another aspect of the present disclosure, a method for measuring an intermittent operating life (IOL) of GaN-based devices under test (DUT) is provided. The method comprises: stressing, by a stressing unit, the DUT by applying a regulated stressing power $P_{str}$ to the DUT to increase a junction temperature of the DUT to an ON-junction temperature $T_{jON}$; measuring, by a controlling unit, a drain-to-source resistance $R_{ds}$ of the DUT and determining the drain-source resistance $R_{ds}$ to be an ON-drain-source resistance $R_{ds\_ON}$ of the DUT when the junction temperature of the DUT reaches the ON-junction temperature $T_{jON}$; cooling, by a cooling unit, the DUT to decrease the junction temperature of the DUT to an OFF junction temperature $T_{jOFF}$; measuring, by the controlling unit, the drain-to-source resistance $R_{ds}$ of the DUT and determining the drain-source resistance $R_{ds}$ to be an OFF-drain-source resistance $R_{ds\_OFF}$ of the DUT when the junction temperature of the DUT reaches the OFF junction temperature $T_{jOFF}$.

In comparison with conventional approaches, the provided measuring system and method can achieve higher measurement accuracy because it adopts a power regulation approach to ensure that devices of the same thermal resistance have same temperature increase during the IOL test. It eliminates the influence caused by parasitic parameters of testing circuits and the inconsistency of threshold voltage and drain-source resistance of the device itself. Through power regulation, it is the junction temperature of the device, not the temperature of the device housing (or package), being directly controlled. Therefore, the present invention has advantages over the approaches of measuring device package temperature that the influence by the package structure, a PCB heat dissipation mechanism, and the testing circuit itself can be eliminated.

BRIEF DESCRIPTION OF THE DRAWINGS

Aspects of the present disclosure are readily understood from the following detailed description when read with the accompanying figures. It should be noted that various features may not be drawn to scale. That is, the dimensions of the various features may be arbitrarily increased or reduced for clarity of discussion. Embodiments of the present disclosure are described in more detail hereinafter with reference to the drawings, in which.

DETAILED DESCRIPTION

In the following description, embodiments of an intermittent operating life (IOL) testing system and method for operating the same are set forth as preferred examples in accordance with the subject application. It will be apparent to those skilled in the art that modifications, including additions and/or substitutions may be made without departing from the scope and spirit of the invention. Specific details may be omitted so as not to obscure the invention; however, the disclosure is written to enable one skilled in the art to practice the teachings herein without undue experimentation.

Reference in this specification to "one embodiment" or "an embodiments" means that a particular feature, structure, or characteristic described in connection with the embodiment is included in at least one of the embodiments of the invention. The appearances of the phrase "in one embodiment" or "in some embodiments" in various places in the specifications are not necessarily all referring to the same embodiments, nor are separate or alternative embodiments mutually exclusive of other embodiments. Moreover, various features are described which may be exhibited by some embodiments and not by others.

Figure 1:
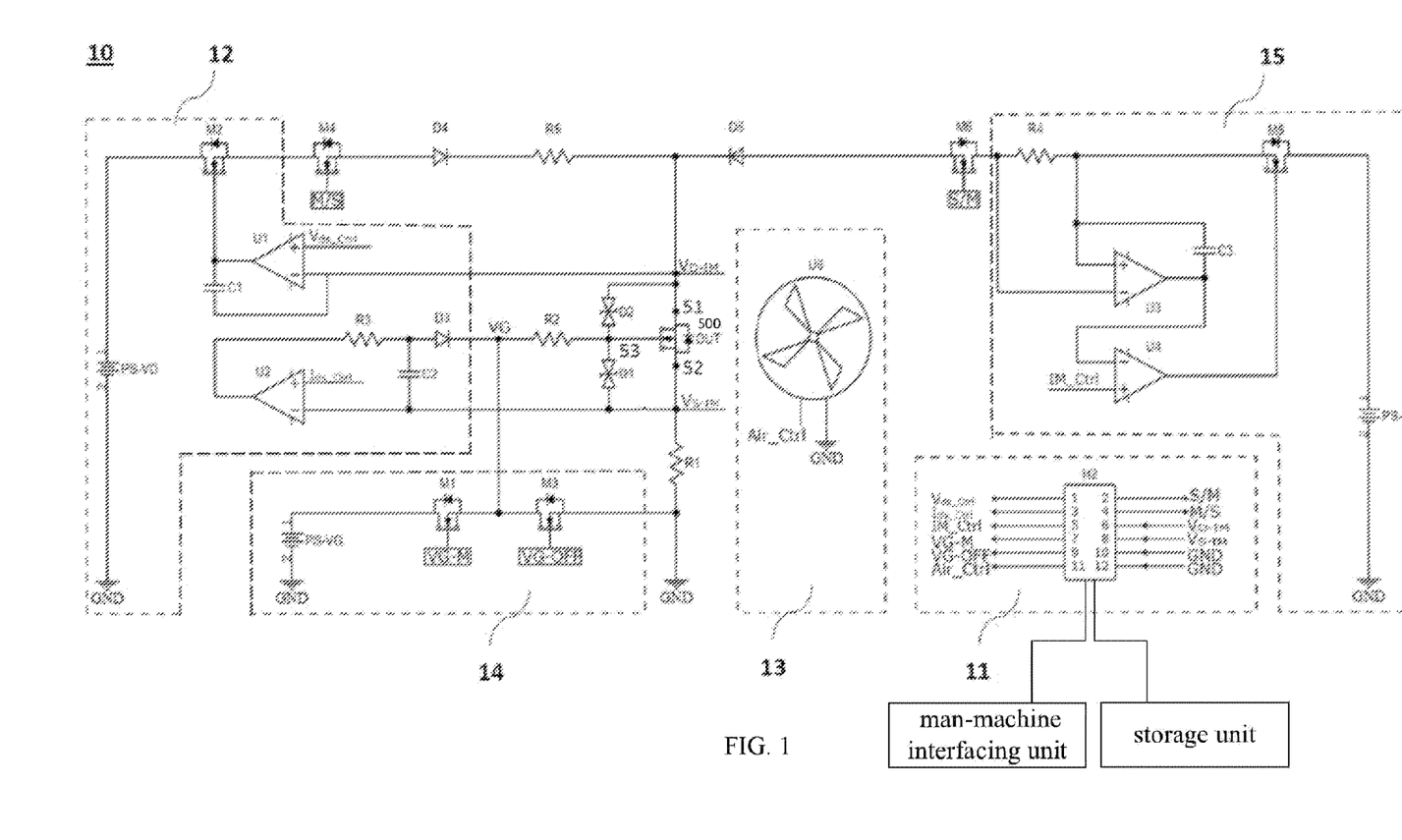
FIG. 1 depicts a circuit diagram of an intermittent operating life (IOL) testing system and how it is connected to a GaN-based device under test (DUT) according to an embodiment of the subject application.

FIG. 1 depicts a circuit diagram of an intermittent operating life (IOL) testing system 10 and how it is connected to a GaN-based device under test (DUT) 500 according to an embodiment of the subject application. The testing system 10 may be operated in a stressing mode where the DUT is stressed to have its junction temperature increased to an ON-junction temperature $T_{jON}$; a cooling mode where the DUT is cooled to have its junction temperature decreased to an OFF junction temperature $T_{jOFF}$; and a measure mode where the drain-source resistance $R_{ds}$ of the DUT is measured. The DUT may have a first power terminal (or drain terminal) 51, a second power terminal (or source terminal) 52, and a control terminal (or gate terminal) 53.

Preferably, the testing system 10 may comprise a current limiting resistor R1 connected between a ground GND and the source terminal 52 of the DUT. The testing system 10 may further comprise a current limiting resistor R2 connected between a VG node and the gate terminal 53 of the DUT. The testing system 10 may further comprise a first transient voltage suppressing diode D1 connected between the gate terminal 53 and the source terminal 52 of the DUT, and a second transient voltage suppressing diode D2 connected between the gate terminal 53 and the drain terminal 51 of the DUT.

The testing system 10 may further comprise a controlling unit 11. The controlling unit 11 may be configured to detect a signal $V_{D\_IM}$ from the drain terminal 51 of the DUT and a signal $V_{S\_IM}$ from the source terminal 52 of the DUT when the testing system 10 is operated in the measure mode. The controlling unit 11 may be further configured to compute a drain-source resistance $R_{ds}$ of the DUT, wherein $R_{ds}$ is given by $$R_{ds} = \frac{R1 \times (V_{D\_IM} - V_{S\_IM})}{V_{S\_IM}}.$$

The controlling unit 11 may be further configured to determine the drain-source resistance $R_{ds}$ to be an ON-drain-source resistance $R_{ds\_ON}$ of the DUT if the drain-source resistance $R_{ds}$ is obtained when the junction temperature of the DUT reaches an ON-junction temperature $T_{jON}$. In other words, the controlling unit 11 may be configured to determine the ON-drain-source resistance $R_{ds\_ON}$ of the DUT when the testing system 10 is operated in a measure mode occurred after the testing system 10 being operated in a stressing mode.

The controlling unit 11 may be further configured to determine the drain-source resistance $R_{ds}$ to be an OFF-drain-source resistance $R_{ds\_OFF}$ of the DUT if the drain-source resistance $R_{ds}$ is obtained when the junction temperature of the DUT reaches an OFF junction temperature $T_{jOFF}$. In other words, the controlling unit 11 may be configured to determine the OFF-drain-source resistance $R_{ds\_OFF}$ of the DUT when the testing system 10 is operated in a measure mode occurred after the testing system 10 being operated in a cooling mode.

The testing system 10 may further comprise a stressing unit 12 configured for applying a regulated stressing power $P_{str}$ to the DUT to increase the junction temperature of the DUT to the ON-junction temperature $T_{jON}$ when the system is operated in the stressing mode.

The ON-junction temperature $T_{jON}$ is given by $T_{jON}=P_{str}\times R_{th(j-a)}+T_a$, where $T_a$ is the ambient temperature and $R_{th(j-a)}$ is the junction thermal resistance of the DUT at the ambient temperature $T_a$.

The stressing power $P_{str}$ is given by $P_{str}=I_{ds\_str}*V_{ds\_str}$, where $I_{ds\_str}$ is a drain-source current passing through the DUT, and $V_{ds\_str}$ is a drain-source voltage applied across the DUT.

Therefore, by controlling and regulating the drain-source current $I_{ds\_str}$ and drain-source voltage $V_{ds\_str}$, a desired ON-junction temperature junction temperature of DUT can be achieved.

The stressing unit 12 may be further configured to receive a first reference signal $V_{ds\_Ctrl}$ and a second reference signal $I_{ds\_Ctrl}$ from the controlling unit 11. The stressing unit 12 may further be configured to detect the signal $V_{D\_IM}$ from the drain terminal 51 of the DUT and the signal $V_{S\_IM}$ from the source terminal 52 of the DUT. The stressing unit 12 may further be configured to regulate the drain-source current $I_{ds\_str}$ passing through the DUT and the drain-source voltage $V_{ds\_str}$ applied across the DUT to achieve a desired stressing power $P_{str}$.

The stressing unit 12 may be further configured to control a voltage applied to the drain terminal 51 of the DUT based on the received reference signals $V_{ds\_Ctrl}$ and the detected signal $V_{D\_IM}$ to regulate the drain-source voltage $V_{ds\_str}$ to be equal to $V_{ds\_Ctrl}$.

The stressing unit 12 may be configured control a voltage applied to the VG node based on the received reference signals $I_{ds\_Ctrl}$ and the detected signal $V_{S\_IM}$ to regulate a drain-source current $I_{ds\_str}$ to be equal to $$\frac{I_{ds\_Ctrl}}{R1}.$$

Therefore, a desired stressing power $P_{str}$ may be achieved by adjusting the reference signals $I_{ds\_Ctrl}$ and $V_{ds\_Ctrl}$, as the stressing power $P_{str}$ is given by $P_{str}=I_{ds\_str}*V_{ds\_str}=(I_{ds\_Ctrl}*V_{ds\_Ctrl})/R1$. A desired ON-junction temperature $T_{jON}$ is then achieved by applying the desired stressing power $P_{str}$.

The testing system 10 may further comprise a fourth diode D4 configured for allowing the drain-source current $I_{ds\_str}$ flowing only in one direction from the stressing unit 12 to the drain terminal 51 of the DUT.

The testing system 10 may further comprise a fourth switching device M4 configured to receive a control signal M/S from the controlling unit 11 for conducting or blocking the drain-source current $I_{ds\_str}$ flowing from the stressing unit 12 to the drain terminal 51 of the DUT.

The fourth diode D4 may have a cathode coupled to the drain terminal 51 of the DUT and an anode connected to a source terminal of the fourth switching device M4. In some embodiments, the testing system 10 may further comprise a current limiting resistor R5 connected between the cathode of the fourth diode D4 and the drain terminal 51 of the DUT.

The fourth switching device M4 may have a drain terminal connected to the stressing unit 12; a source terminal connected to the anode of the fourth diode D4; and a gate terminal connected to the controlling unit 11 for receiving the control signal M/S.

The controlling unit 11 may be configured to turn on the fourth switching device M4 to conduct the drain-source current $I_{ds\_str}$ flowing from the stressing unit 12 to the drain terminal 51 of the DUT when the testing system 10 is operated in the stressing mode; and turn off the fourth switching device M4 to block the drain-source current $I_{ds\_str}$ flowing from the stressing unit 12 to the drain terminal 51 of the DUT when the system is not operated in the stressing mode.

In some embodiments, the stressing unit 12 may comprise a first operational amplifier U1; a second operational amplifier U2, a second switching device M2; a stressing power supply PS_VD; a resistor R3, a third diode D3, a first capacitor C1, and a second capacitor C2.

The stressing power supply PS_VD may have a positive terminal connected to a drain terminal of the second switching device M2 and a negative terminal connected to a ground GND.

The first operational amplifier U1 may have an inverting input connected to the drain terminal 51 of the DUT; a non-inverting input connected to the controlling unit for receiving the reference signal $V_{ds\_Ctrl}$ and an output connected to a gate terminal of the second switching device M2.

The second switching device M2 may have a drain terminal connected to the positive terminal of the stressing power supply PS_VD, a source terminal connected to the drain terminal of the fourth switching device M4; and a gate terminal connected to the output of the first operational amplifier U1.

The first capacitor C1 may have a first terminal connected to the inverting input of the first operational amplifier U1 and a second terminal connected to the output of the first operational amplifier U1.

The second operational amplifier U2 may have an inverting input connected to the source terminal 52 of the DUT, a non-inverting input connected to the controlling unit for receiving the reference signal $I_{ds\_Ctrl}$ and an output connected a first terminal of the resistor R3.

The third diode D3 may have a cathode connected to the VG node and an anode connected to a second terminal of the resistor R3.

The second capacitor C2 may have a first terminal connected to the second terminal of the resistor R3 and the anode of the third diode D3; and a second terminal connected to the inverting input of the second operational amplifier U2.

The resistor R3 may have its first terminal connected to the output of the second operational amplifier U2 and its second terminal connected to the first terminal of the second capacitor C2 and the anode of the third diode D3.

The testing system 10 may further comprise a cooling unit 13 configured for cooling the DUT to decrease the junction temperature of the DUT to the OFF junction temperature $T_{jOFF}$ when the system is operated in the cooling mode, wherein the OFF junction temperature $T_{jOFF}$ is given by $T_{jOFF}=T_a$, where $T_a$ is the ambient temperature which may be measured with a thermal couple.

The cooling unit 13 may comprise a fan configured to receive a control signal Air_Ctrl from the controlling unit 11 and generate a flow of air surrounding the DUT to cool down the DUT.

The testing system 10 may further comprise a gate-bias unit 14 connected to the VG node. The gate-bias unit 14 may be configured to receive a control signal VG_M from the controlling unit to turn on the DUT when the system is operated in the measure mode; and receive a control signal VG_OFF from the controlling unit to turn off the DUT when the system is operated in the cooling mode.

The gate-bias unit 14 may comprise a gate-bias power supply PS_VG and a first switching device M1. The first switching device M1 may be configured to receive the control signal VG_M from the controlling unit to connect the gate-bias power supply PS_VG to the VG node or disconnect the gate-bias power supply PS_VG from the VG node.

The controlling unit may be configured to control the first switching device M1 to connect the gate-bias power supply PS_VG to the VG node to turn on the DUT when the system is operated in the measure mode; and disconnect the gate-bias power supply PS_VG from the VG node when the system is not operated in the measure mode.

The gate-bias unit 14 may further comprise a third switching device (M3) configured to receive a control signal VG_OFF from the controlling unit to connect a ground GND to the VG node to turn off the DUT or disconnect the ground GND from the VG node.

The controlling unit may be configured to control the third switching device M3 to connect the ground GND to the VG node to turn off the DUT when the system is operated in the cooling mode; and disconnect the ground GND from the VG node when the system is not operated in the cooling mode.

The testing system 10 may further comprise a measure-bias unit 15 configured to receive a reference signal IM_Ctrl from the controlling unit 11 and supply a regulated drain-source current $I_{ds\_mea}$ to the DUT when the testing system 10 is operated in the measure mode.

The testing system 10 may further comprise a fifth diode D5 configured for allowing the drain-source current $I_{ds\_mea}$ flowing only in one direction from the measure-bias unit 15 to the drain terminal 51 of the DUT.

The testing system 10 may further comprise a sixth switching device M6 configured to receive a control signal S/M from the controlling unit 11 for conducting or blocking the drain-source current $I_{ds\_mea}$ flowing from the measure-bias unit to the drain terminal 51 of the DUT.

The fifth diode D5 may have a cathode connected to the drain terminal 51 of the DUT and an anode connected to a source terminal of the sixth switching device M6.

The sixth switching device M6 may have a drain terminal connected to the measure-bias unit 15; a source terminal connected to the anode of the fifth diode D5; and a gate terminal connected to the controlling unit 11 for receiving the control signal S/M.

The controlling unit 11 may be configured to turn on the sixth switching device M6 to conduct the drain-source current $I_{ds\_mea}$ flowing from the measure-bias unit 15 to the drain terminal 51 of the DUT when the testing system 10 is operated in the measure mode; and turn off the sixth switching device M6 to block the drain-source current $I_{ds\_mea}$ flowing from the measure-bias unit 15 to the drain terminal 51 of the DUT when the system is not operated in the measure mode.

The measure-bias unit 15 may comprise a third operational amplifier U3, a fourth operational amplifier U4, a fifth switching device M5, a measure-bias power supply PS_VM, a third capacitor C3, and a fourth resistor R4.

The measure-bias power supply PS_VM may have a positive terminal connected to a drain terminal of the fifth switching device M5 and a negative terminal connected to a ground GND.

The third operational amplifier U3 may have an inverting input connected to the drain terminal of the sixth switching device M6; a non-inverting input connected to a source terminal of the fifth switching device M5 and an output connected to an inverting input of the fourth operational amplifier U4.

The fourth operational amplifier U4 may have an inverting input connected to the output of the third operational amplifier U3; a non-inverting input connected to the controlling unit 11 for receiving the reference signal IM_Ctrl; and an output connected to a gate terminal of the fifth switching device M5.

The fifth switching device M5 may have a drain terminal connected to the positive terminal of the measure-bias power supply PS_VM, a source terminal connected to the non-inverting terminal of the third operational amplifier U3; and a gate terminal connected to the output of the fourth operational amplifier U4.

The third capacitor C3 may have a first terminal connected to the output of the third operational amplifier U3 and a second terminal connected to the non-inverting input of the third operational amplifier U3.

The fourth resistor R4 may have a first terminal connected to the inverting input of the third operational amplifier U3; and a second terminal connected to the non-inverting input of the third operational amplifier U3.

The testing system 10 may further comprise a man-machine interfacing unit configured for facilitating a user to select and set up operation modes and displaying operation setting menus and measurement results.

The testing system 10 may further comprise a storage unit configured for storing operation setting parameters and measurement results.

Figure 2:
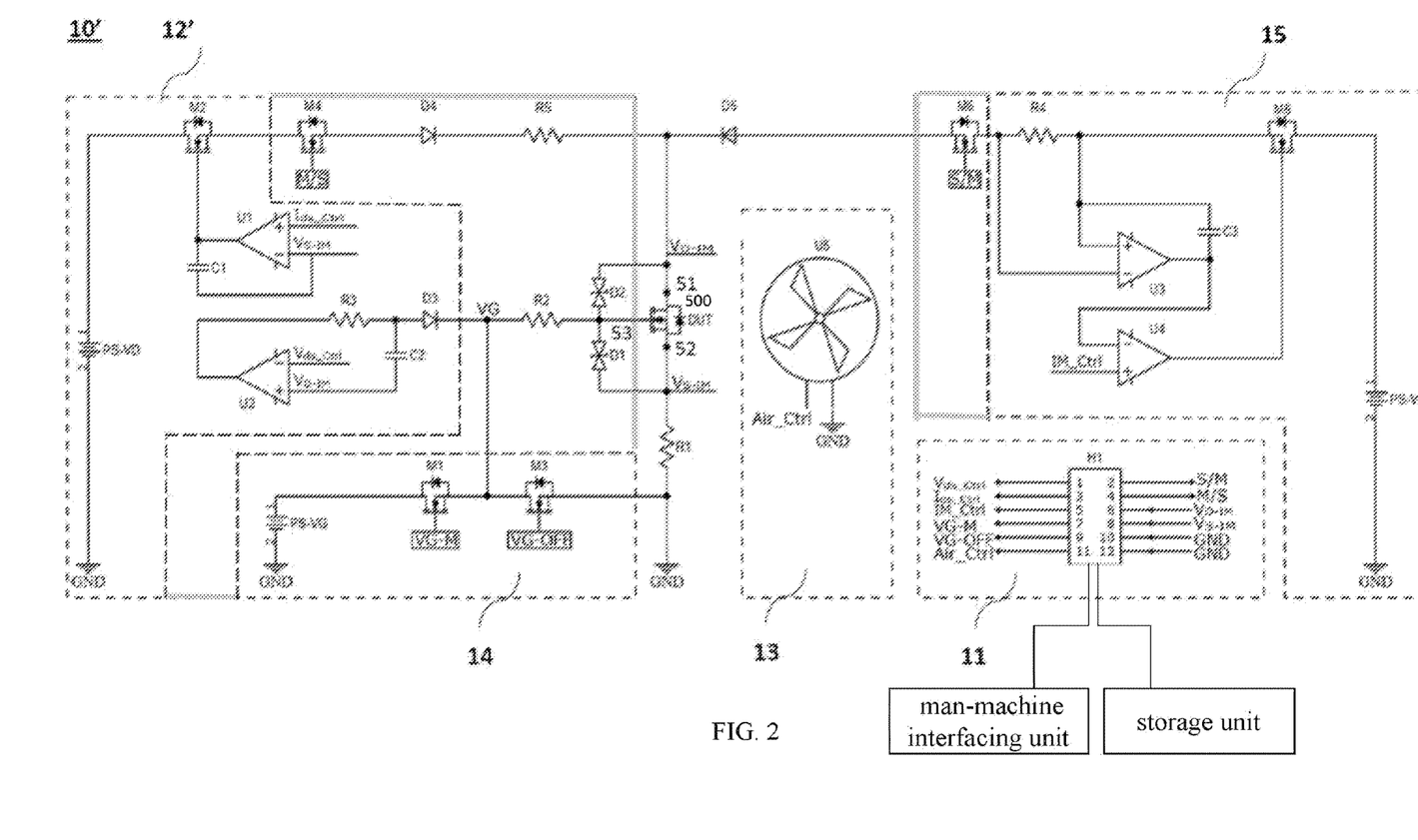
FIG. 2 depicts a circuit diagram of an intermittent operating life (IOL) testing system and how it is connected to a GaN-based device under test (DUT) according to another embodiment of the subject application.

FIG. 2 depicts a circuit diagram of an intermittent operating life (IOL) testing system 10' and how it is connected to a GaN-based device under test (DUT) 500 according to another embodiment of the subject application. The testing system 10' in FIG. 2 is similar to the testing system 10 of FIG. 1 except for having a different stressing unit 12' from the stressing unit 12. For simplicity, identical elements are given the same reference numerals.

The testing system 10' may be operated in a stressing mode where the DUT is stressed to have its junction temperature increased to an ON-junction temperature $T_{jON}$; a cooling mode where the DUT is cooled to have its junction temperature decreased to an OFF junction temperature $T_{jOFF}$; and a measure mode where the drain-source resistance $R_{ds}$ of the DUT is measured. The DUT may have a first power terminal (or drain terminal) 51, a second power terminal (or source terminal) 52, and a control terminal (or gate terminal) 53.

Preferably, the testing system 10' may comprise a current limiting resistor R1 connected between a ground GND and the source terminal 52 of the DUT. The testing system 10' may further comprise a current limiting resistor R2 connected between a VG node and the gate terminal 53 of the DUT. The testing system 10' may further comprise a first transient voltage suppressing diode D1 connected between the gate terminal 53 and the source terminal 52 of the DUT, and a second transient voltage suppressing diode D2 connected between the gate terminal 53 and the drain terminal 51 of the DUT.

The testing system 10' may further comprise a controlling unit 11. The controlling unit 11 may be configured to detect a signal $V_{D\_IM}$ from the drain terminal 51 of the DUT and a signal $V_{S\_IM}$ from the source terminal 52 of the DUT when the testing system 10' is operated in the measure mode. The controlling unit 11 may be further configured to compute a drain-source resistance $R_{ds}$ of the DUT, wherein $R_{ds}$ is given by $$R_{ds} = \frac{R1 \times (V_{D\_IM} - V_{S\_IM})}{V_{S\_IM}}.$$

The controlling unit 11 may be further configured to determine the drain-source resistance $R_{ds}$ to be an ON-drain-source resistance $R_{ds\_ON}$ of the DUT if the drain-source resistance $R_{ds}$ is obtained when the junction temperature of the DUT reaches an ON-junction temperature $T_{jON}$. In other words, the controlling unit 11 may be configured to determine the ON-drain-source resistance $R_{ds\_ON}$ of the DUT when the testing system 10' is operated in a measure mode occurred after the testing system 10' being operated in a stressing mode.

The controlling unit 11 may be further configured to determine the drain-source resistance $R_{ds}$ to be an OFF-drain-source resistance $R_{ds\_OFF}$ of the DUT if the drain-source resistance $R_{ds}$ is obtained when the junction temperature of the DUT reaches an OFF junction temperature $T_{jOFF}$. In other words, the controlling unit 11 may be configured to determine the OFF-drain-source resistance $R_{ds\_OFF}$ of the DUT when the testing system 10' is operated in a measure mode occurred after the testing system 10' being operated in a cooling mode.

The testing system 10' may further comprise a stressing unit 12' configured for applying a regulated stressing power $P_{str}$ to the DUT to increase the junction temperature of the DUT to the ON-junction temperature $T_{jON}$ when the system is operated in the stressing mode.

The ON-junction temperature $T_{jON}$ is given by $T_{jON}=P_{str} \times R_{th(j-a)} T_a$, where $T_a$ is the ambient temperature and $R_{th(j-a)}$ is the junction thermal resistance of the DUT at the ambient temperature $T_a$.

The stressing power $P_{str}$ is given by $P_{str}=I_{ds\_str} * V_{ds\_str}$, where $I_{ds\_str}$ is a drain-source current passing through the DUT, and $V_{ds\_str}$ is a drain-source voltage applied across the DUT.

Therefore, by controlling and regulating the drain-source current $I_{ds\_str}$ and drain-source voltage $V_{ds\_str}$, a desired ON-junction temperature junction temperature of DUT can be achieved.

The stressing unit 12' may be further configured to receive a first reference signal $V_{ds\_Ctrl}$ and a second reference signal $I_{ds\_Ctrl}$ from the controlling unit 11. The stressing unit 12' may further be configured to detect the signal $V_{D\_IM}$ from the drain terminal 51 of the DUT and the signal $V_{S\_IM}$ from the source terminal 52 of the DUT. The stressing unit 12' may further be configured to regulate the drain-source current $I_{ds\_str}$ passing through the DUT and the drain-source voltage $V_{ds\_str}$ applied across the DUT to achieve a desired stressing power $P_{str}$.

The stressing unit 12' may be further configured to control a voltage applied to the drain terminal 51 of the DUT based on the received reference signals $I_{ds\_Ctrl}$ and the detected signal VS-IM to regulate the drain-source current $I_{ds\_str}$ to be equal to $$\frac{I_{ds\_Ctrl}}{R1}.$$

The stressing unit 12' may be further configured to control a voltage applied to the VG node based on the received reference signals $V_{ds\_Ctrl}$ and the detected signal $V_{D\_IM}$ to regulate the drain-source voltage $V_{ds\_str}$ to be equal to $V_{ds\_Ctrl}$.

Therefore, a desired stressing power $P_{str}$ may be achieved by adjusting the reference signals $I_{ds\_Ctrl}$ and $V_{ds\_Ctrl}$, as the stressing power $P_{str}$ is given by $P_{str}=I_{ds\_str} * V_{ds\_str}$ ($I_{ds\_Ctrl} * V_{ds\_Ctrl}$)/R1.

The testing system 10' may further comprise a fourth diode D4 configured for allowing the drain-source current $I_{ds\_str}$ flowing only in one direction from the stressing unit 12' to the drain terminal 51 of the DUT.

The testing system 10' may further comprise a fourth switching device M4 configured to receive a control signal M/S from the controlling unit 11 for conducting or blocking the drain-source current $I_{ds\_str}$ flowing from the stressing unit 12' to the drain terminal 51 of the DUT.

The fourth diode D4 may have a cathode coupled to the drain terminal 51 of the DUT and an anode connected to a source terminal of the fourth switching device M4. In some embodiments, the testing system 10 may further comprise a current limiting resistor R5 connected between the cathode of the fourth diode D4 and the drain terminal 51 of the DUT.

The fourth switching device M4 may have a drain terminal connected to the stressing unit 12'; a source terminal connected to the anode of the fourth diode D4; and a gate terminal connected to the controlling unit 11 for receiving the control signal M/S.

The controlling unit 11 may be configured to turn on the fourth switching device M4 to conduct the drain-source current $I_{ds\_str}$ flowing from the stressing unit 12' to the drain terminal 51 of the DUT when the testing system 10' is operated in the stressing mode; and turn off the fourth switching device M4 to block the drain-source current $I_{ds\_str}$ flowing from the stressing unit 12' to the drain terminal 51 of the DUT when the system is not operated in the stressing mode.

In some embodiments, the stressing unit 12' may comprise a first operational amplifier U1; a second operational amplifier U2, a second switching device M2; a stressing power supply PS_VD; a resistor R3, a third diode D3, a first capacitor C1 and a second capacitor C2.

The stressing power supply PS_VD may have a positive terminal connected to a drain terminal of the second switching device M2 and a negative terminal connected to a ground GND.

The first operational amplifier U1 may have an inverting input connected to the source terminal 52 of the DUT for detecting the signal $V_{S\_IM}$; a non-inverting input connected to the controlling unit 11 for receiving the reference signal $I_{ds\_Ctrl}$ and an output connected to a gate terminal of the second switching device M2.

The second switching device M2 may have a drain terminal connected to the positive terminal of the stressing power supply PS_VD, a source terminal connected to the drain terminal of the fourth switching device M4; and a gate terminal connected to the output of the first operational amplifier U1.

The first capacitor C1 may have a first terminal connected to the inverting input of the first operational amplifier U1 and a second terminal connected to the output of the first operational amplifier U1.

The second operational amplifier U2 may have a non-inverting input connected to the drain terminal 51 of the DUT for detecting the signal $V_{D\_IM}$; an inverting input connected to the controlling unit 11 for receiving the reference signal $V_{ds\_Ctrl}$ and an output connected the first terminal of the resistor R3.

The third diode D3 may have a cathode connected to the VG node and an anode connected to a second terminal of the resistor R3.

The second capacitor C2 may have a first terminal connected to the second terminal of the resistor R3 and the anode of the third diode D3; and a second terminal connected to the non-inverting input of the second operational amplifier U2.

The resistor R3 may have its first terminal connected to the output of the second operational amplifier U2 and its second terminal connected to the first terminal of the second capacitor C2 and the anode of the third diode D3.

The testing system 10' may further comprise a cooling unit 13 configured for cooling the DUT to decrease the junction temperature of the DUT to the OFF junction temperature $T_{jOFF}$ when the system is operated in the cooling mode, wherein the OFF junction temperature $T_{jOFF}$ is given by $T_{jOFF}=T_a$, where $T_a$ is the ambient temperature which may be measured with a thermal couple.

The cooling unit 13 may comprise a fan configured to receive a control signal Air_Ctrl from the controlling unit 11 and generate a flow of air surrounding the DUT to cool down the DUT.

The testing system 10' may further comprise a gate-bias unit 14 connected to the VG node. The gate-bias unit 14 may be configured to receive a control signal VG_M from the controlling unit 11 to turn on the DUT when the system is operated in the measure mode; and receive a control signal VG_OFF from the controlling unit 11 to turn off the DUT when the system is operated in the cooling mode.

The gate-bias unit 14 may comprise a gate-bias power supply PS_VG and a first switching device M1. The first switching device M1 may be configured to receive the control signal VG_M from the controlling unit 11 to connect the gate-bias power supply PS_VG to the VG node or disconnect the gate-bias power supply PS_VG from the VG node.

The controlling unit 11 may be configured to control the first switching device M1 to connect the gate-bias power supply PS_VG to the VG node to turn on the DUT when the system is operated in the measure mode; and disconnect the gate-bias power supply PS_VG from the VG node when the system is not operated in the measure mode.

The gate-bias unit 14 may further comprise a third switching device (M3) configured to receive a control signal VG_OFF from the controlling unit 11 to connect a ground GND to the VG node to turn off the DUT or disconnect the ground GND from the VG node.

The controlling unit 11 may be configured to control the third switching device M3 to connect the ground GND to the VG node to turn off the DUT when the system is operated in the cooling mode; and disconnect the ground GND from the VG node when the system is not operated in the cooling mode.

The testing system 10' may further comprise a measure-bias unit 15 configured to receive a reference signal IM_Ctrl from the controlling unit 11 and supply a regulated drain-source current $I_{ds\_mea}$ to the DUT when the testing system 10' is operated in the measure mode.

The testing system 10' may further comprise a fifth diode D5 configured for allowing the drain-source current $I_{ds\_mea}$ flowing only in one direction from the measure-bias unit 15 to the drain terminal 51 of the DUT.

The testing system 10' may further comprise a sixth switching device M6 configured to receive a control signal S/M from the controlling unit 11 for conducting or blocking the drain-source current $I_{ds\_mea}$ flowing from the measure-bias unit 15 to the drain terminal 51 of the DUT.

The fifth diode D5 may have a cathode connected to the drain terminal 51 of the DUT and an anode connected to a source terminal of the sixth switching device M6.

The sixth switching device M6 may have a drain terminal connected to the measure-bias unit 15; a source terminal connected to the anode of the fifth diode D5; and a gate terminal connected to the controlling unit 11 for receiving the control signal S/M.

The controlling unit 11 may be configured to turn on the sixth switching device M6 to conduct the drain-source current $I_{ds\_mea}$ flowing from the measure-bias unit 15 to the drain terminal 51 of the DUT when the testing system 10' is operated in the measure mode; and turn off the sixth switching device M6 to block the drain-source current $I_{ds\_mea}$ flowing from the measure-bias unit 15 to the drain terminal 51 of the DUT when the system is not operated in the measure mode.

The measure-bias unit 15 may comprise a third operational amplifier U3, a fourth operational amplifier U4, a fifth switching device M5, a measure-bias power supply PS_VM, a third capacitor C3, and a fourth resistor R4.

The measure-bias power supply PS_VM may have a positive terminal connected to a drain terminal of the fifth switching device M5 and a negative terminal connected to a ground GND.

The third operational amplifier U3 may have an inverting input connected to the drain terminal of the sixth switching device M6; a non-inverting input connected to a source terminal of the fifth switching device M5 and an output connected to an inverting input of the fourth operational amplifier U4.

The fourth operational amplifier U4 may have an inverting input connected to the output of the third operational amplifier U3; a non-inverting input connected to the controlling unit 11 for receiving the reference signal IM_Ctrl; and an output connected to a gate terminal of the fifth switching device M5.

The fifth switching device M5 may have a drain terminal connected to the positive terminal of the measure-bias power supply PS_VM, a source terminal connected to the non-inverting terminal of the third operational amplifier U3; and a gate terminal connected to the output of the fourth operational amplifier U4.

The third capacitor C3 may have a first terminal connected to the output of the third operational amplifier U3 and a second terminal connected to the non-inverting input of the third operational amplifier U3.

The fourth resistor R4 may have a first terminal connected to the inverting input of the third operational amplifier U3; and a second terminal connected to the non-inverting input of the third operational amplifier U3.

The testing system 10' may further comprise a man-machine interfacing unit configured for facilitating a user to select and set up operation modes and displaying operation setting menus and measurement results.

The testing system 10' may further comprise a storage unit configured for storing operation setting parameters and measurement results.

Figure 3:
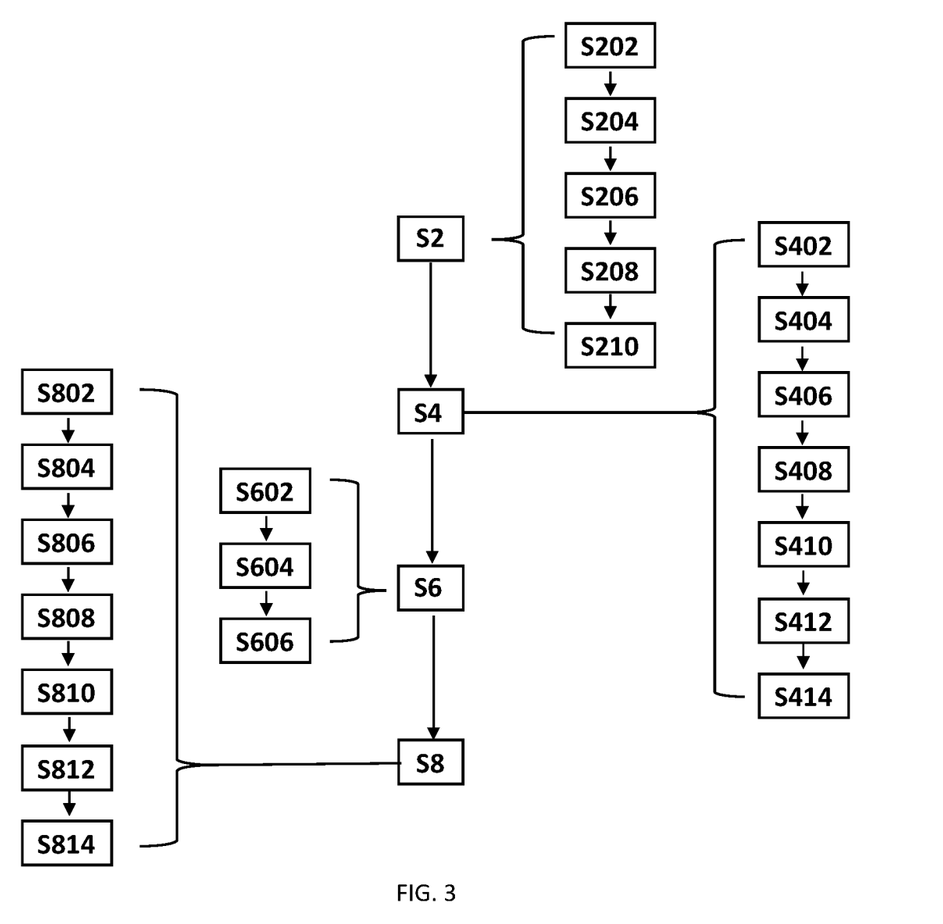
FIG. 3 depicts a flowchart of a method for operating a testing system for measuring an intermittent operating life (IOL) of a GaN-based device according to an embodiment of the present disclosure.

FIG. 3 depicts a flowchart of a method of operating a testing system for measuring an intermittent operating life (IOL) of a GaN-based device according to an embodiment of the present disclosure.

The DUT may have a first power terminal (or drain terminal) 51, a second power terminal (or source terminal) 52, and a control terminal (or gate terminal) 53. The testing system may be operated in a stressing mode, a cooling mode and a measure mode. The method comprises:

S2: stressing, by a stressing unit, the DUT by applying a regulated stressing power $P_{str}$ to the DUT to increase a junction temperature of the DUT to an ON-junction temperature $T_{jON}$; wherein the regulated stressing power $P_{str}$ is given by $P_{str}=I_{ds\_str}*V_{ds\_str}$, where $I_{ds\_str}$ is a regulated drain-source current $I_{ds\_str}$ passing through the DUT, and $V_{ds\_str}$ is a regulated drain-source voltage across the DUT;

S4: measuring, by a controlling unit, a drain-to-source resistance $R_{ds}$ of the DUT and determining the drain-source resistance $R_{ds}$ to be an ON-drain-source resistance $R_{ds\_ON}$ of the DUT when the junction temperature of the DUT reaches the ON-junction temperature $T_{jON}$;

S6: cooling, by a cooling unit, the DUT to decrease the junction temperature of the DUT to an OFF junction temperature $T_{jOFF}$.

S8: measuring, by the controlling unit, a drain-to-source resistance $R_{ds}$ of the DUT and determining the drain-source resistance $R_{ds}$ to be an OFF-drain-source resistance $R_{ds\_OFF}$ of the DUT when the junction temperature of the DUT reaches the OFF junction temperature $T_{jOFF}$.

The ON-junction temperature $T_{jON}$ of the DUT is given by $T_{jON}=P_{str} \times R_{th(j-a)}+T_a$, where $T_a$ is the ambient temperature, $R_{th(j-a)}$ is the junction thermal resistance of the DUT at the ambient temperature, and $P_{str}$ is the stressing power applied to the DUT.

The OFF junction temperature $T_{jOFF}$ of the DUT is given by $T_{jOFF}=T_a$, where $T_a$ is the ambient temperature which may be measured with a thermal couple.

In some embodiments, the step S2 of stressing the DUT may comprise:

S202: switching off, by the controlling unit, a sixth switching device M6 to block any current flowing from a measure-bias unit to the drain terminal of the DUT;

S204: switching on, by the controlling unit, a fourth switching device M4 to allow a drain-source current $I_{ds\_str}$ flowing from the stressing unit to the drain terminal of the DUT;

S206: receiving, by the stressing unit, a reference signal $I_{ds\_Ctrl}$ from the controlling unit;

S208: regulating, by the stressing unit, the drain-source current $I_{ds\_str}$ passing through the DUT based on the reference signal $I_{ds\_Ctrl}$;

S210: receiving, by the stressing unit, a reference signal $V_{ds\_Ctrl}$ from the controlling unit; and S212: regulating, by the stressing unit, the drain-source voltage $V_{ds\_str}$ applied across the DUT based on the reference signal $V_{ds\_Ctrl}$.

The step S4 of measuring the ON-drain-source resistance $R_{ds\_ON}$ of the DUT may comprise:

S402: switching off, by the controlling unit, the fourth switching device M4 to block any current flowing from the stressing unit to the drain terminal of the DUT;

S404: switching on, by the controlling unit, the sixth switching device M6 to allow a drain-source current $I_{ds\_mea}$ flowing from the measure-bias unit to the drain terminal of the DUT;

S406: sending, by the controlling unit, a control signal VG_M to a first switching device M1, to switch on the first switching device M1 to connect the gate terminal of the DUT to a power supply PS_VG to turn on the DUT;

S408: receiving, by the measure-bias unit, a reference signal IM_Ctrl from the controlling unit;

S410: regulating, by the measure-bias unit, a drain-source current $I_{ds\_mea}$ based on the received reference signal IM_Ctrl;

S412: receiving, by the controlling unit, a signal $V_{D\_IM}$ from the drain terminal and a signal $V_{S\_IM}$ from the source terminal of the DUT;

S414: determining, by the controlling unit, the ON-drain-source resistance $R_{ds\_ON}$ of the DUT, wherein $R_{ds\_ON}$ is given by $$R_{ds\_ON} = \frac{R1 \times (V_{D\_IM} - V_{S\_IM})}{V_{S\_IM}};$$

where R1 is a resistor connected between the source terminal of the DUT and a ground GND.

The step S6 of cooling the DUT may comprise:

S602: switching off, by the controlling unit, the sixth switching device M6 to block any current flowing from the measure-bias unit to the drain terminal of the DUT;

S604: switching on, by the controlling unit, a third switching device M3 to connect the gate terminal of the DUT to a ground GND to turn off the DUT; and S606: turning on, by the controlling unit, a fan to cool down the DUT for a preset period of time.

The step S8 of measuring the OFF-drain-to-source resistance $R_{ds\_OFF}$ of the DUT may comprise:

S802: switching off, by the controlling unit, the fourth switching device M4 to block any current flowing from the stressing unit to the drain terminal of the DUT;

S804: switching on, by the controlling unit, a sixth switching device M6 to allow a drain-source current $I_{ds\_mea}$ flowing from a measure-bias unit to the drain terminal of the DUT;

S806: sending, by the controlling unit, a control signal VG_M to a first switching device M1, to switch on the first switching device M1 to connect the gate terminal of the DUT to a power supply PS_VG to turn on the DUT;

S808: receiving, by the measure-bias unit, a reference signal IM_Ctrl from the controlling unit;

S810: regulating, by the measure-bias unit, a drain-source current $I_{ds\_mea}$ based on the received reference signal IM_Ctrl;

S812: receiving, by the controlling unit, a signal $V_{D\_IM}$ from the drain terminal and a signal $V_{S\_IM}$ from the source terminal of the DUT;

S814: determining, the OFF-drain-source resistance $R_{ds\_OFF}$ of the DUT, wherein $R_{ds\_OFF}$ is given by $$R_{ds\_OFF} = \frac{R1 \times (V_{D\_IM} - V_{S\_IM})}{V_{S\_IM}};$$

where R1 is a resistor connected between the source terminal of the DUT and a ground GND.

Figure 4:
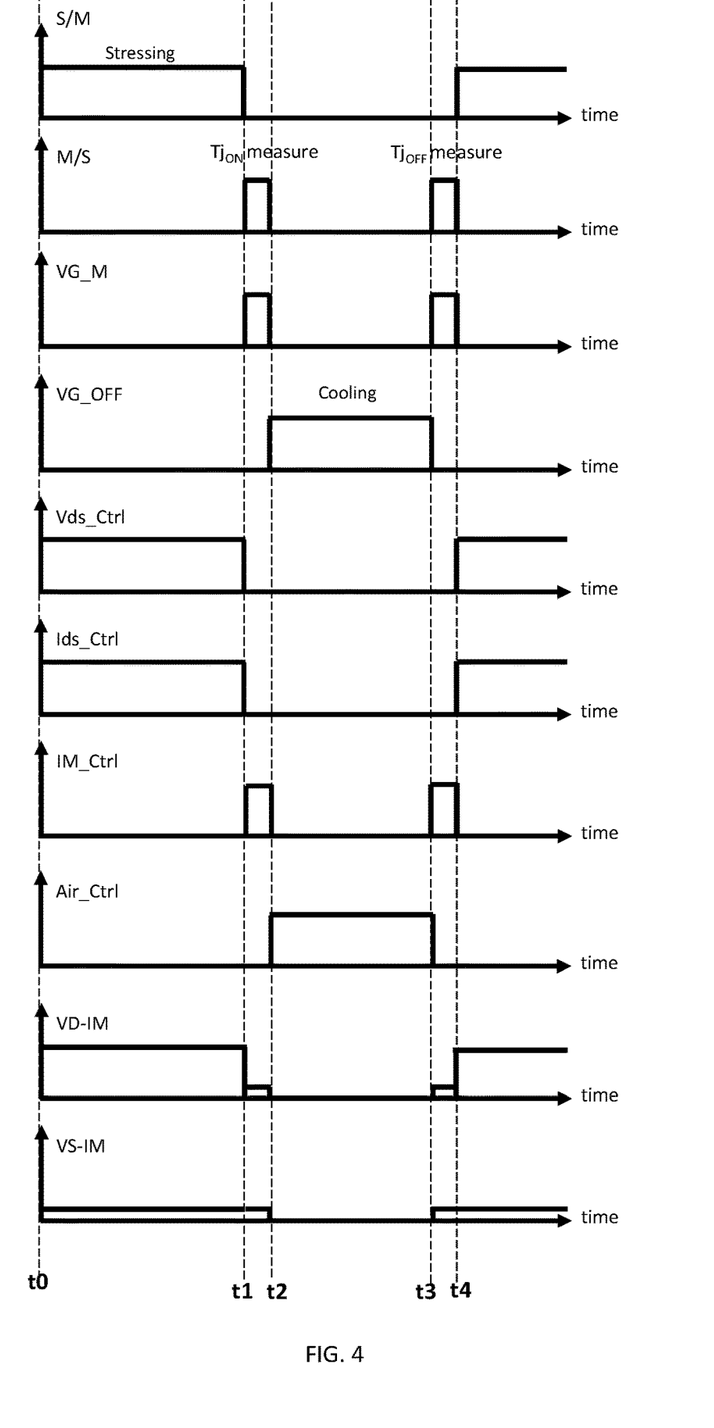
FIG. 4 depicts signal waveforms of operation of the testing system 10 according to some embodiments of the subject application.

FIG. 4 depicts operation signal waveforms of the testing systems 10 or 10' according to some embodiments of the subject application.

Referring to FIG. 4, when the testing system is operated in the stressing mode during a time duration from t0 to t1, the signals S/M, $V_{ds\_Ctrl}$, $I_{ds\_Ctrl}$ are set to high potential, while the signals M/S, VG_M, VG_OFF, IM_Ctrl and Air_Ctrl are set to zero potential.

When the testing system is operated in the measure mode for measuring the $T_{jON}$ during a time duration from t1 to t2, the signals M/S, VG_M and IM_Ctrl are set to high potential while the signals S/M, VG_OFF, $V_{ds\_Ctrl}$, $I_{ds\_Ctrl}$ and Air_Ctrl are set to zero potential.

When the testing system is operated in the cooling mode during a time duration from t2 to t3, the signals VG_OFF and Air_Ctrl are set to high potential while the signals S/M, M/S, VG_M, $V_{ds\_Ctrl}$, $I_{ds\_Ctrl}$, IM_Ctrl and Air_Ctrl are set to zero potential.

When the testing system is operated in the measure mode for measuring the $T_{jOFF}$ from t3 to t4, the signals M/S, VG_M and IM_Ctrl are set to high potential while the signals S/M, VG_OFF, $V_{ds\_Ctrl}$, $I_{ds\_Ctrl}$ and Air_Ctrl are set to zero potential.

As a result, the voltage signal $V_{D\_IM}$ is regulated to a high level when the testing system is operated at the stressing mode (from t0 to t1), and a low level when the testing system is operated at the measure mode (from t1 to t2, or from t3 to t4). The current signal VS-IM will be regulated to a constant level when the testing system is operated at the stressing mode (from t0 to t1), as well as at the measure mode (from t1 to t2, or from t3 to t4).

The foregoing description of the present invention has been provided for the purposes of illustration and description. It is not intended to be exhaustive or to limit the invention to the precise forms disclosed. Many modifications and variations will be apparent to the practitioner skilled in the art.

The embodiments were chosen and described in order to best explain the principles of the invention and its practical application, thereby enabling others skilled in the art to understand the invention for various embodiments and with various modifications that are suited to the particular use contemplated.

While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

The invention claimed is:

1. A system for measuring an intermittent operating life (IOL) of a GaN-based device under test (DUT), the system being operable in a stressing mode, a cooling mode, and a measure mode, the system being operable in the stressing mode, the measure mode, the cooling mode, and the measure mode in sequence, and comprising:
   a controlling circuit configured for detecting a signal $V_{D\_IM}$ from a drain terminal of the DUT and a signal $V_{S\_IM}$ from a source terminal of the DUT and computing a drain-source resistance $R_{ds}$ of the DUT when the system is operated in the measure mode;
   a stressing circuit configured for applying a regulated stressing power $P_{str}$ to the DUT to increase a junction temperature of the DUT to an ON-junction temperature $T_{jON}$ when the system is operated in the stressing mode, wherein the regulated stressing power $P_{str}$ is given by $P_{str}=I_{ds\_str}*V_{ds\_str}$, where $I_{ds\_str}$ is a regulated drain-source current passing through the DUT and $V_{ds\_str}$ is a regulated drain-source voltage $V_{ds\_str}$ across the DUT;
   a cooling circuit configured for, after the DUT is turned off, cooling the DUT to decrease the junction temperature of the DUT to an OFF junction temperature $T_{jOFF}$;
   a gate-bias circuit configured to receive a control signal VG_M from the controlling circuit to turn on the DUT when the system is operated in the measure mode; and receive a control signal VG_OFF from the controlling circuit to turn off the DUT when the system is operated in the cooling mode; and
   a measure-bias circuit configured to receive, after the DUT is turned on, a reference signal IM_Ctrl from the controlling circuit and supply a regulated drain-source current $I_{ds\_mea}$ to the DUT when the system is operated in the measure mode, such that the controlling circuit computes the drain-source resistance $R_{ds}$ of the DUT;
   wherein the controlling circuit is further configured to
   determine the drain-source resistance $R_{ds}$ to be an ON-drain-source resistance $R_{ds\_ON}$ of the DUT if the drain-source resistance $R_{ds}$ is obtained when the junction temperature of the DUT reaches the ON-junction temperature $T_{jON}$; and
   determine the drain-source resistance $R_{ds}$ to be an OFF-drain-source resistance $R_{ds\_OFF}$ of the DUT if the drain-source resistance $R_{ds}$ is obtained when the junction temperature of the DUT reaches the OFF junction temperature $T_{jOFF}$;
   wherein the gate-bias circuit comprises a gate-bias power supply PS_VG and a first switching device M1 connected to the gate-bias power supply PS_VG; an end of the first switching device M1 is connected to the gate-bias power supply PS_VG, and another end of the first switching device M1 is connected to a VG node; the VG node is connected to a gate of the DUT; the controlling circuit is configured to control the first switching device M1 to connect the gate-bias power supply PS_VG to the VG node to turn on the DUT when the system is operated in the measure mode;
   wherein the gate-bias circuit further comprises a third switching device M3; an end of the third switching device M3 is connected to a ground GND, and another end of the third switching device M3 is connected to the VG node; the third switching device M3 is configured to receive a control signal VG_OFF from the controlling circuit to connect the ground GND to the VG node to turn off the DUT.

2. The system according to claim 1, wherein the $T_{jON}$ is given by $T_{jON}=P_{str}\times R_{th(j-a)}+T_a$, where $T_a$ is an ambient temperature and $R_{th(j-a)}$ is a junction thermal resistance of the DUT at the ambient temperature $T_a$.

3. The system according to claim 1, wherein the OFF junction temperature $T_{jOFF}$ is given by $T_{jOFF}=T_a$, where $T_a$ is an ambient temperature.

4. The system according to claim 1, wherein the stressing circuit is further configured to:
   receive a first reference signal $V_{ds\_Ctrl}$ and a second reference signal $I_{ds\_Ctrl}$ from the controlling circuit;
   detect the signal $V_{D\_IM}$ from the drain terminal of the DUT and the signal $V_{S\_IM}$ from the source terminal of the DUT;
   control a voltage applied to the drain terminal of the DUT based on the received first reference signals $V_{ds\_Ctrl}$ and the detected signal $V_{D\_IM}$ to regulate the drain-source voltage $V_{ds\_str}$ to be equal to $V_{ds\_Ctrl}$; and
   control a voltage applied to the VG node based on the received second reference signals $I_{ds\_Ctrl}$ and the detected signal $V_{S\_IM}$ to regulate the drain-source current $I_{ds\_str}$ to be equal to $$\frac{I_{ds\_Ctrl}}{R1}.$$

5. The system according to claim 1, further comprising a fourth diode D4 having a cathode coupled to the drain terminal of the DUT, and configured for allowing the drain-source current $I_{ds\_str}$ flowing only in one direction from the stressing circuit to the drain terminal of the DUT.

6. The system according to claim 5, further comprising a fourth switching device M4 having a drain terminal connected to the stressing circuit, a source terminal connected to an anode of the fourth diode D4, and a gate terminal connected to the controlling circuit.

7. The system according to claim 6, wherein the controlling circuit is further configured to
   turn on the fourth switching device M4 to conduct the drain-source current $I_{ds\_str}$ flowing from the stressing circuit to the drain terminal of the DUT when the system is operated in the stressing mode; and turn off the fourth switching device M4 to block the drain-source current $I_{ds\_str}$ flowing from the stressing circuit to the drain terminal of the DUT when the system is not operated in the stressing mode.

8. The system according to claim 1, further comprising a fifth diode D5 having a cathode connected to the drain terminal of the DUT and configured for allowing the drain-source current $I_{ds\_mea}$ flowing only in one direction from the measure-bias circuit to the drain terminal of the DUT.

9. The system according to claim 8, further comprising a sixth switching device M6 having a drain terminal connected to the measure-bias circuit, a source terminal connected to an anode of the fifth diode D5, and a gate terminal connected to the controlling circuit for receiving a control signal S/M.

10. The system according to claim 8, wherein the controlling circuit is configured to turn on the sixth switching device M6 to conduct the drain-source current $I_{ds\_mea}$ flowing from the measure-bias circuit to the drain terminal of the DUT when the testing system is operated in the measure mode; and turn off the sixth switching device M6 to block the drain-source current $I_{ds\_mea}$ flowing from the measure-bias circuit to the drain terminal of the DUT when the system is not operated in the measure mode.

11. The system according to claim 1, wherein the cooling circuit comprises a fan configured to receive a control signal Air_Ctrl from the controlling circuit and generate a flow of air surrounding the DUT to cool down the DUT.

12. The system according to claim 1, further comprising a man-machine interfacing unit configured for facilitating a user to select and set up operation modes and displaying operation setting menus and measurement results.

13. The system according to claim 1, further comprising a storage unit configured for storing operation setting parameters and measurement results.

14. A method for measuring an intermittent operating life (IOL) of a GaN-based devices under test (DUT) having a source terminal, a drain terminal, and a gate terminal, the method comprising:
    stressing, by a stressing circuit, the DUT by applying a regulated stressing power $P_{str}$ to the DUT to increase a junction temperature of the DUT to an ON-junction temperature $T_{jON}$; wherein the regulated stressing power $P_{str}$ is given by $P_{str}=I_{ds\_str}*V_{ds\_str}$, where $I_{ds\_str}$ is a regulated drain-source current $I_{ds\_str}$ passing through the DUT, and $V_{ds\_str}$ is a regulated drain-source voltage across the DUT;
    measuring, by a controlling circuit, a drain-source resistance $R_{ds}$ of the DUT and determining the drain-source resistance $R_{ds}$ to be an ON-drain-source resistance $R_{ds\_ON}$ of the DUT when the junction temperature of the DUT reaches the ON-junction temperature $T_{jON}$;
    cooling, by a cooling circuit, the DUT to decrease the junction temperature of the DUT to an OFF junction temperature $T_{jOFF}$; and
    measuring, by the controlling circuit, the drain-source resistance $R_{ds}$ of the DUT and determining the drain-source resistance $R_{ds}$ to be an OFF-drain-source resistance $R_{ds\_OFF}$ of the DUT when the junction temperature of the DUT reaches the OFF junction temperature $T_{jOFF}$.

15. The method according to claim 14, wherein the $T_{jON}$ is given by $T_{jON}=P_{str}\times R_{th(j-a)}+T_a$, where $T_a$ is an ambient temperature and $R_{th(j-a)}$ a junction thermal resistance of the DUT at the ambient temperature $T_a$.

16. The method according to claim 14, wherein the OFF-junction temperature $T_{jOFF}$ is given by $T_{jOFF}=T_a$ where $T_a$ is an ambient temperature.

17. The method according to claim 14, wherein the step of stressing the DUT comprises:
    switching off, by the controlling circuit, a sixth switching device M6 to block any current flowing from a measure-bias circuit to the drain terminal of the DUT;
    switching on, by the controlling circuit, a fourth switching device M4 to allow a drain-source current $I_{ds\_str}$ flowing from the stressing circuit to the drain terminal of the DUT;
    receiving, by the stressing circuit, a reference signal $I_{ds\_Ctrl}$ from the controlling circuit;
    regulating, by the stressing unit circuit, the drain-source current $I_{ds\_str}$ passing through the DUT based on the reference signal $I_{ds\_Ctrl}$;
    receiving, by the stressing circuit, a reference signal $V_{ds\_Ctrl}$ from the controlling circuit; and
    regulating, by the stressing circuit, a drain-source voltage $V_{ds\_str}$ applied across the DUT based on the reference signal $V_{ds\_Ctrl}$.

18. The method according to claim 14, wherein the step of measuring the ON-drain-source resistance $R_{ds\_ON}$ of the DUT comprises:
    switching off, by the controlling circuit, a fourth switching device M4 to block any current flowing from the stressing circuit to the drain terminal of the DUT;
    switching on, by the controlling circuit, a sixth switching device M6 to allow a drain-source current $I_{ds\_mea}$ flowing from a measure-bias circuit to the drain terminal of the DUT;
    switching on, by the controlling circuit, a first switching device M1 to connect the gate terminal of the DUT to a power supply PS_VG to turn on the DUT;
    receiving, by the measure-bias circuit, a reference signal IM_Ctrl from the controlling circuit;
    regulating, by the measure-bias circuit, the drain-source current $I_{ds\_mea}$ based on the received reference signal IM_Ctrl;
    receiving, by the controlling circuit, a signal $V_{D\_IM}$ from the drain terminal of the DUT and a signal $V_{S\_IM}$ from the source terminal of the DUT; and
    determining, by the controlling circuit, the ON-drain-source resistance $R_{ds\_ON}$ of the DUT, wherein $R_{ds\_ON}$ is given by $$R_{ds\_ON} = \frac{R1 \times (V_{D\_IM} - V_{S\_IM})}{V_{S\_IM}};$$

where R1 is a resistor connected between the source terminal of the DUT and a ground GND.

19. The method according to claim 14, wherein the step of cooling the DUT comprises:
    switching off, by the controlling circuit, a sixth switching device M6 to block any current flowing from the measure-bias circuit to the drain terminal of the DUT;
    switching on, by the controlling circuit, a third switching device M3 to connect the gate terminal of the DUT to a ground GND to turn off the DUT; and
    turning on, by the controlling circuit, a fan to cool down the DUT for a preset period of time.

20. The method according to claim 14, wherein the step of measuring the OFF-drain-source resistance $R_{ds\_OFF}$ of the DUT comprises:

switching off, by the controlling circuit, a fourth switching device M4 to block any current flowing from the stressing circuit to the drain terminal of the DUT;

switching on, by the controlling circuit, a sixth switching device M6 to allow a drain-source current $I_{ds\_mea}$ flowing from a measure-bias circuit to the drain terminal of the DUT;

switching on, by the controlling circuit, a first switching device M1 to connect the gate terminal of the DUT to a power supply PS_VG to turn on the DUT;

receiving, by the measure-bias circuit, a reference signal IM_Ctrl from the controlling circuit;

regulating, by the measure-bias circuit, the drain-source current $I_{ds\_mea}$ based on the received reference signal IM_Ctrl;

receiving, by the controlling circuit, a signal $V_{D\_IM}$ from the drain terminal of the DUT and a signal $V_{S\_IM}$ from the source terminal of the DUT; and determining, by the controlling circuit, the OFF-drain-source resistance $R_{ds\_OFF}$ of the DUT, wherein $R_{ds\_OFF}$ is given by $$R_{ds\_OFF} = \frac{R1 \times (V_{D\_IM} - V_{S\_IM})}{V_{S\_IM}};$$

where R1 is a resistor connected between the source terminal of the DUT and a ground GND.

* * * * *